(12) United States Patent
Choi

(10) Patent No.: US 6,214,498 B1
(45) Date of Patent: Apr. 10, 2001

(54) LITHOGRAPHY MASK AND A FABRICATING METHOD THEREOF

(75) Inventor: Yong-Kyoo Choi, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/375,431

(22) Filed: Aug. 17, 1999

(30) Foreign Application Priority Data

Mar. 16, 1999 (KR) ..................................... 99-8833

(51) Int. Cl.⁷ ................................. G03F 9/00; G03C 5/00
(52) U.S. Cl. ................................................. 430/5; 430/296
(58) Field of Search ............................. 430/5, 296, 322, 430/323

(56) References Cited

U.S. PATENT DOCUMENTS 5,798,194 * 8/1998 Nakasuji et al. ......................... 430/5
5,876,881 * 3/1999 Kawata ..................................... 430/5

* cited by examiner

Primary Examiner—S. Rosasco
(74) Attorney, Agent, or Firm—Fleshner & Kim, LLP

(57) ABSTRACT

The present invention relates to a lithography mask and a fabricating method thereof, more particularly, to a mask or an aperture for lithography using electron or ion beams in a semiconductor device and a fabricating method thereof which improve thermal stability of a mask by forming a stencil mask of double structures comprised of an upper mask that absorbs and releases most of electron energy and a lower mask that defines patterns with electron/ion beams, thereby improving the reliance of fine patterns on an exposure process. The present invention includes a first stencil mask having a first aperture pattern wherein a first electrically conductive layer is formed on a whole surface of the first stencil mask and wherein first beam-penetrating parts are formed in the first aperture pattern, a first protruding part on the edge of the upper face of the first stencil mask, and a second stencil mask having a second aperture pattern wherein a second electrically conductive layer is formed on a whole surface of the second stencil mask, wherein second beam-penetrating parts equal to or bigger than the first beam-penetrating parts and wherein the second stencil mask is attached to the first protruding part.

20 Claims, 6 Drawing Sheets

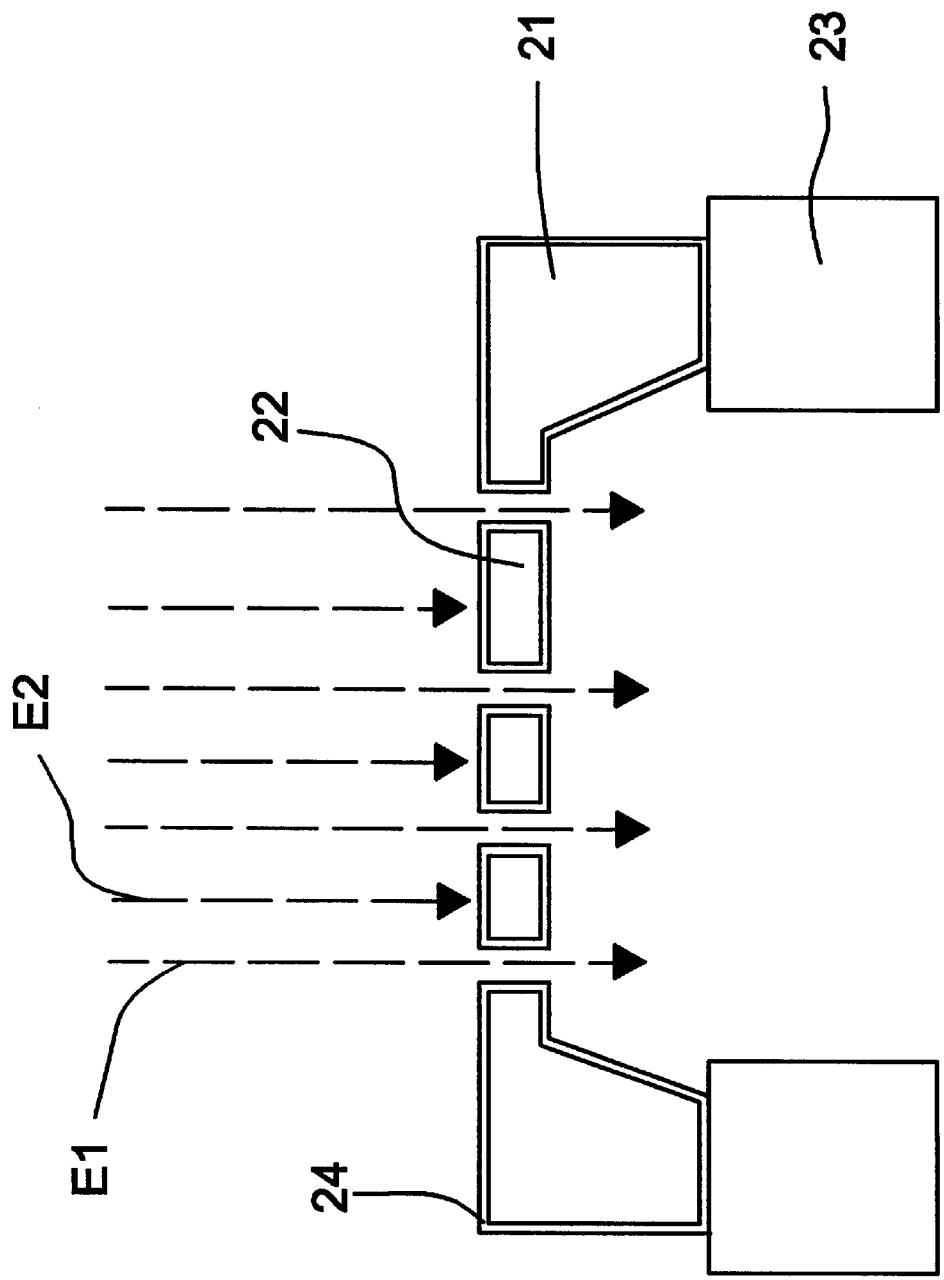

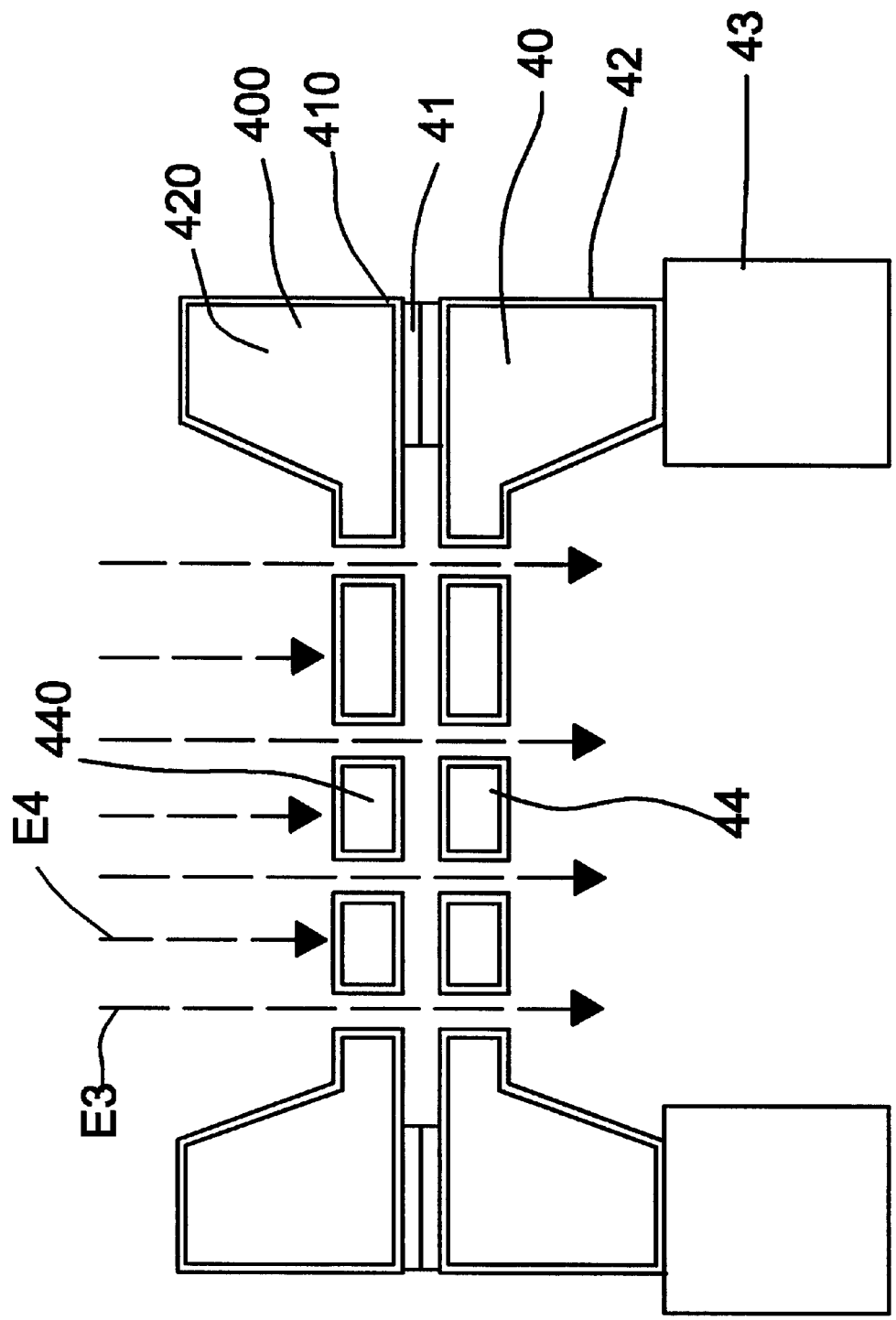

LITHOGRAPHY MASK AND A FABRICATING METHOD THEREOF

BACKGROUND OF THE INVENTION

1. Field of Invention

The present invention relates to a lithography mask and a fabricating method thereof, more particularly, to a mask or an aperture for lithography using electron or ion beams in a semiconductor device and a fabricating method thereof which improves thermal stability of a mask by forming a stencil mask of double structures comprised of an upper mask that absorbs and releases most of electron energy and a lower mask that defines patterns with electron/ion beams, thereby improving the reliance of fine patterns on an exposure process.

2. Discussion of Related Art

There are various kinds of lithography processes for fabricating a semiconductor device such as optical lithography, electron beam lithography, ion beam lithography, X-ray lithography and the like. They are sorted by the species of lights irradiated during each of the lithography processes. For all of the lithographies, the mask is one of the challenges. In optical lithography, generally, quartz or glass is transparent and a thin metal film is highly absorbing. In other lithographies, the radiation has more energy per particle such as photon, ion or electron and so the task of forming a spatially varying dose by means of a mask is more difficult.

In a lithography process, after a mask having predetermined patterns has been fabricated, an exposure step is accomplished by irradiating lights or beams selectively to the resist on a substrate through the mask. Thus, it is the major concern of the lithography that a precise mask pattern should be defined.

A stencil mask is used in electron beam lithography or ion beam lithography. The stencil mask is back 'illuminated' by a broad beam of ions or electrons, and its demagnified image is projected onto a resist covered substrate.

Unfortunately, as the energy of the projected particles is very large and the pattern images become more microscopic, distortion is generated on the mask pattern. The main sources of distortion are thought to be stress relief due to the cutting of holes and the thermal expansion due to mask heating by the incident electrons/ions. In this case, the generated heat is lost by radiation and by conduction, generally. Namely, heat is lost by radial conduction and by radiation from the mask's face.

A stencil mask of a thin film is fabricated by a process of fabricating a semiconductor device using a semiconductor substrate of silicon, etc., which is disclosed in U.S. Pat. No. 5,770,336. FIG. 1A to FIG. 1F show cross-sectional views of fabricating a lithography mask in a semiconductor device according to a related art.

Referring to FIG. 1A, surfaces of first and second silicon layers 10 and 12 of a silicon on insulator(hereinafter abbreviated SOI) wafer is planarized by chemical mechanical polishing(hereinafter abbreviated CMP). In this case, a silicon oxide layer 11 is inserted in the SOI wafer between the first and second silicon layers 10 and 12. The silicon oxide layer 11 insulates the first and second silicon layers 10 and 12 from each other.

Referring to FIG. 1B, an insulating layer to form a hard mask is formed by depositing an oxide layer about 1.0 μm thick on an exposed surface of the second silicon layer 12 by chemical vapor deposition(hereinafter abbreviated CVD).

After the insulating layer of oxide has been coated with photoresist, a first photoresist pattern 14 is defined by exposure and development in use of electron beams to form a first stencil mask pattern on the second silicon layer 12.

A portion of the oxide layer is removed by etching the oxide layer in use of the first photoresist pattern 14 as an etch mask. Thus, an oxide layer 13 beneath the first photoresist pattern 14 remains only.

Referring to FIG. 1C, a first stencil mask pattern 120 is formed by removing a portion of the second silicon layer which is not covered with the remaining oxide layer 13 and the first photoresist pattern 14 by means of dry etch.

Then, a surface of the remaining second silicon layer 120, side faces of the insulating layer 110 of oxide and a partial surface of the first silicon layer 10 are exposed by removing the first photoresist pattern 14 and the remaining oxide layer 13.

A nitride layer 15 is formed to the predetermined thickness on a whole surface of the wafer including the exposed second silicon layer 120, the side faces of the insulating interlayer 110 of oxide and the first silicon layer 10 by CVD.

Referring to FIG. 1D, a bottom surface of the first silicon layer 10 is laid upward by turning upside down the wafer. After the nitride layer 15 on the surface of the first silicon layer 10 has been coated with photoresist, a second photoresist pattern 16 to define a second stencil pattern on the first silicon layer 10 is defined by carrying out exposure and development on the photoresist. In this case, the second photoresist pattern 16 is formed to correspond to the first stencil pattern 120 consisting of the remaining second silicon layer 120. And, the size of the second photoresist pattern 16 is decided to give a second stencil pattern, which will be formed, a desired critical dimension.

Referring to FIG. 1E, an etch mask 150 on the first silicon layer 101 is formed by removing a portion of the nitride layer which is not covered with the second photoresist pattern on the first silicon layer. The, portion of the nitride layer within the apertures of the first stencil pattern 120 is exposed by etching the first silicon layer exposed by the etch mask 150.

Thus, a second stencil pattern 101 consisting of the remaining first silicon layer 101 is formed. Yet, a stencil mask is not completed because a portion of the nitride layer 150 still remains at the boundary between the first and second stencil patterns 120 and 101 where the apertures are formed. Referring to FIG. 1F, the remaining nitride layer on a whole surface of the wafer is removed by wet etch. Thus, the whole surfaces of the first and second stencil patterns except the portions which are attached to the insulating interlayer 110, as well as the side faces of the insulating interlayer 110 in the apertures, are exposed.

A conductive layer 17 is formed by depositing Pt, Ti or the like on the exposed surface of the wafer by sputtering or CVD. The conductive layer 17 discharges electrons from electron/ion beams.

Accordingly, a stencil mask comprised of the first and second stencil patterns 120 and 101 and the insulating interlayer 110 inserted between the patterns are fabricated.

Further, an electrically-conductive holder, as not shown in the drawing, is attached to the bottom edges of the first stencil pattern 120.

FIG. 2 shows a cross-sectional view of a lithography mask in a semiconductor device according to a related art.

Referring to FIG. 2, a support 21 of a stencil mask is mounted on a holder 23 made of metal. There are a plurality of apertures forming a predetermined pattern 22 in a thin wafer, and the support 21 is located at the edge of the wafer.

A metal layer 24 of Pt, Ti or the like is formed on a whole surface of the stencil mask. A window at the lower part of the stencil mask helps electron/ion beams pass through the apertures easily.

A portion of the projected electron or ion beams E1 successfully passes through the apertures to carry out exposure on a resist coated substrate, while the other portion of the beams E2 blocked by the pattern 22 is discharged outside through the metal layer 24 and the holder 23.

So, a portion of the electron beams E1 passes through the apertures among the pattern 22 and the rest electron beams E2 are blocked by the pattern 22 of silicon, wherein the window is formed by etching the underpart of the stencil mask. Thus, a resist pattern is defined by selective exposure onto the resist below the stencil mask. And, electrons blocked by the stencil mask are grounded through the metal layer 24 of the stencil mask as well as heat generated by irradiated electron beams is lost by radiation and conduction through the metal layer 24, silicon and the holder 23. An electron beam of high energy is used as the image formed by electron beam exposure is improved by high acceleration energy of the beam. Generally, thermal stress is generated on the silicon layer of the stencil mask by the focused electron beam provided that the projected area by the electron beam, the energy and the beam current are 5 $\mu$m×5 $\mu$m, 50 KeV and 1.2 $\mu$A, respectively. Besides, local distortion occurs due to the thermal stress as the projected area is moved to form a selective pattern. Consequently, the location and size of the pattern through exposure is changed by the distortion in the stencil mask.

Unfortunately, as a substance of high thermal conductivity is deposited thick to lose heat generated by electron beams in the related art, the stencil mask pattern alters from what is expected and distortion between the metal and silicon layers.

And, as heat conductivity of oxide is lower than that of silicon in an SOI wafer used in the related art, thermal stress increases to amplify the distortion in accordance with the variation of a spot projected by the electron beams.

Moreover, as the mask pattern become more microscopic, so do the trenches to form apertures. Thus, the reliance of the mask pattern is reduced due to the thinner silicon layer of the mask.

SUMMARY OF THE INVENTION

Accordingly, the present invention is directed to a lithography mask and a fabricating method thereof that substantially obviate one or more of the problems due to limitations and disadvantages of the related art.

The object of the present invention is to provide a lithography mask and a fabricating method thereof which improve thermal stability of a mask by forming a stencil mask of double structures comprised of an upper mask that absorbs and releases most of electron energy and a lower mask that defines patterns with electron/ion beams, thereby improving the reliance of fine patterns on an exposure process.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a first stencil mask having a first aperture pattern wherein a first electrically conductive layer is formed on a whole surface of the first stencil mask and wherein first beam-penetrating parts are formed in the first aperture pattern, a first protruding part on the edge of the upper face of the first stencil mask, and a second stencil mask having a second aperture pattern wherein a second electrically conductive layer is formed on a whole surface of the second stencil mask, wherein second beam-penetrating parts equal to or bigger than the first beam-penetrating parts and wherein the second stencil mask is attached to the first protruding part.

In another aspect, the present invention includes the steps of forming a plurality of first and second trenches on predetermined portions of a wafer, wherein the first trenches have a first pattern and the second trenches have the mirror pattern of the first pattern, wherein first and second chip areas are defined on the wafer, wherein the first and second trenches are formed to a predetermined depth by patterning a front face of the wafer in the first and second chip areas, respectively, forming first and second protruding parts at the edges of the first and second chip areas of the wafer, respectively, forming a plurality of first and second apertures making the first and second trenches pierce the wafer, respectively, by removing predetermined portions of a back face of the wafer, forming first and second chips by separating respectively the first and second chip areas from the wafer, forming first and second electrically conductive layers on surfaces of the first and second chips, respectively, and attaching the second chip to the first chip by aligning the first and second apertures and by attaching the second protruding part to the first protruding part.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention. In the drawings:

FIG. 2 shows a cross-sectional view of a lithography mask in a semiconductor device according to a related art;

FIG. 3 shows a cross-sectional view of a lithography mask in a semiconductor device according to the present invention.

DETAILED DESCRIPTION OF PREFERRED EMBODIMENTS

Figure 1A:
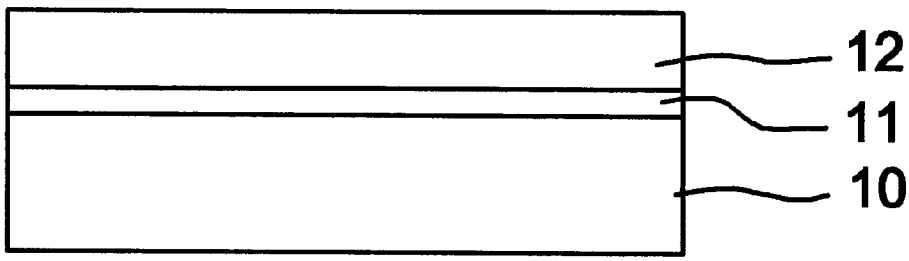
FIG. 1A to FIG. 1F show cross-sectional views of fabricating a lithography mask in a semiconductor device according to a related art.
Figure 1B:
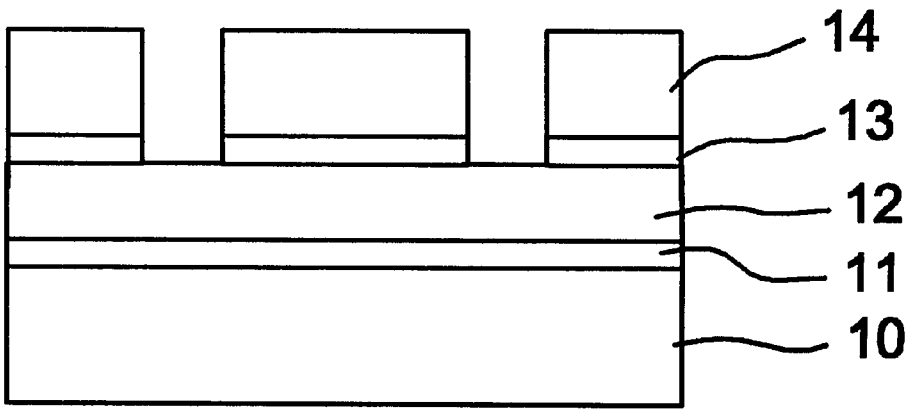
Figure 1C:
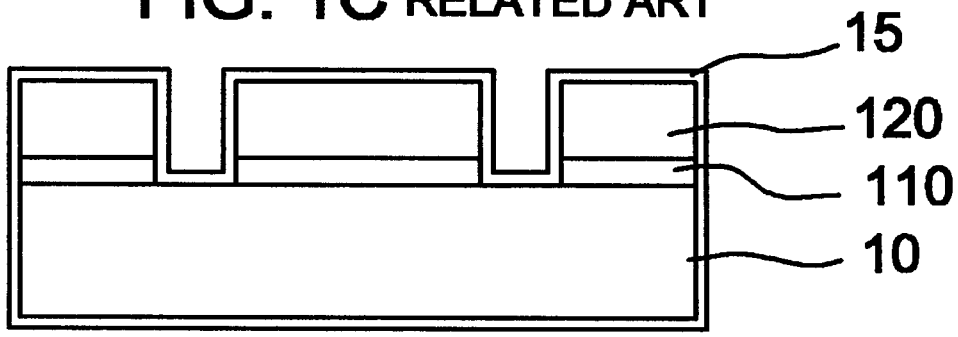
Figure 1D:
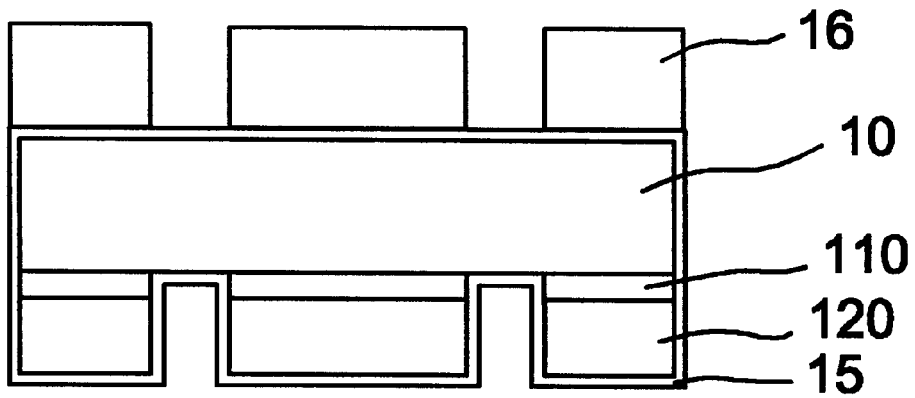
Figure 1E:
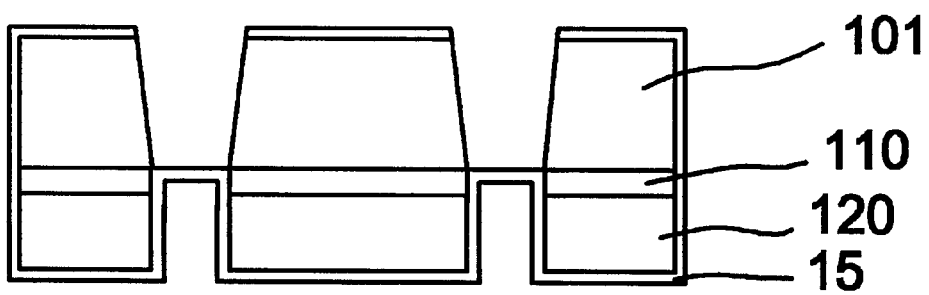
Figure 1F:
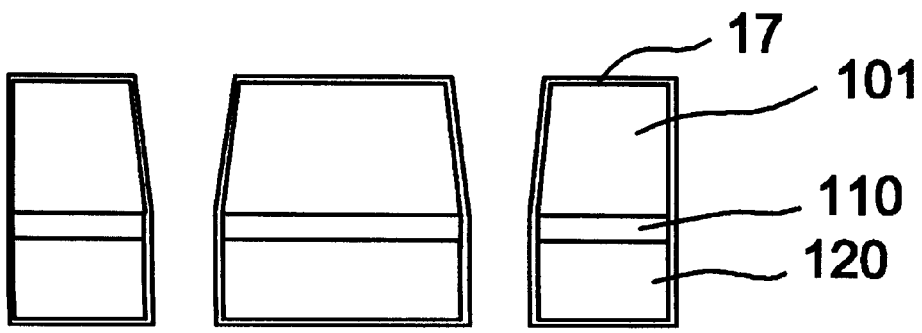

Reference will now be made in detail to the preferred embodiments of the present invention, examples of which are illustrated in the accompanying drawings.

A stencil mask of the present invention, which uses a bulk substrate instead of an SOI wafer, is comprised of an upper mask, a lower mask having a mirror image of the upper mask, and a connecting part which couples the lower mask with the upper wherein the connecting part consists of a substance of which heat conductivity is lower than that of the masks. Therefore, the upper mask is thermally isolated from the lower mask, thereby reducing the heat conductivity each other.

When the stencil mask of the present invention is used for an exposure process in use of electron or ion beams, the upper mask blocks some of the beams and the remaining beams just having passed through the upper mask reaches the lower mask. As the upper mask has a mirror image of the lower, only the beams having passed through the upper mask comes to pass the lower mask. Thus, the energy accumulated in the lower mask is minimized. In this case, the apertures of the upper mask are somewhat bigger than those of the lower for the benefit of a process margin.

FIG. 3 shows a cross-sectional view of a lithography mask in a semiconductor device according to the present invention.

Referring to FIG. 3, a support 40 of a lower mask is attached to a holder 43 made of electrically conductive substance such as metal. The lower mask includes a plurality of apertures forming a predetermined pattern 44 in a wafer. And, the support 40 of the lower mask is at the edge area of the lower mask. A metal layer 42 consisting of Pt, Ti, Pt—Pd or the like is formed on a whole surface of the lower mask. A window, which makes the lower mask thin and helps electron/ion beams pass through the lower mask easily and precisely, is formed by etching the bottom part of the lower mask. A first step 41 made of a substance of which heat conductivity is lower than that of the lower mask is formed on the edge surface of the support 40 of the lower mask.

A second step 410, of which pattern is identical to the first step 41, is formed on the first step 41, and the other support 400 of an upper mask is onto the second step 410. Thus, the upper mask lies on the lower mask in use of the first and second steps 41 and 410 as a connecting media. Moreover, the metal layers 42 and 420 are also formed on the first and second steps 41 and 410, thereby connecting electrically the upper and lower masks each other. Therefore, the upper and lower masks are thermally isolated as well as electrically connected each other.

The upper and lower metal layers 42 and 420 are formed on the first and second steps 41 and 410 to connect electrically the upper and lower masks with each other, which is not good for thermal insulation between the upper and lower masks. Instead, the upper metal layer 420 may be grounded directly to earth without forming the metal layers on the steps 41 and 410.

Although the pattern 440 of the upper mask is defined to have the mirror image of the other pattern 44 of the lower mask, the apertures of the upper mask are defined to be larger than those of the lower.

Another metal layer 420 of Pt, Ti, Pt—Pd or the like is formed on a whole surface of the upper mask for electrical conduction.

As not shown in the drawing, the support 40 of the lower mask is attached to the holder 43 by a metal layer of Zn, Sn or the like or by a silver glue.

The stencil mask of the present invention is largely comprised of the upper and lower parts which are thermally isolated reciprocally. Thus, thermal stress is minimized by losing heat generated from electron beams through the silicon patterns, supports and the metal layers. And, electrons are discharged outside through the metal layers and the holder.

Namely, the electron/ion beams E3 pass through the upper and lower masks via the apertures reach the resist coated substrate to define an image, while the remaining beams E4 which fail to pass the upper mask are lost outside through the metal layers 420 and 42 and the holder 43.

Accordingly, the resist(not shown in the drawing) below the lower mask can be patterned by the selective exposure. In the stencil mask of the present invention, the upper mask blocks the electron/ion beams unnecessary for defining an image on a resist, thereby improving the mask pattern by means of minimizing energy accumulated in the lower mask.

FIG. 4A to FIG. 4F show cross-sectional views of fabricating a lithography mask in a semiconductor device according to the present invention.

Figure 4A:
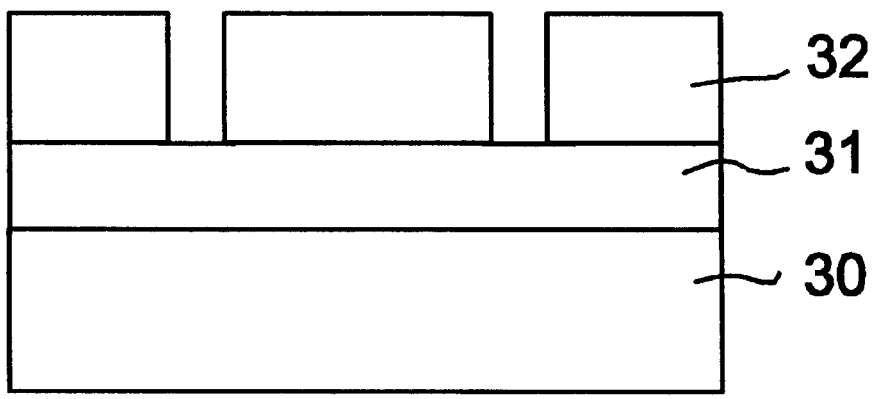
FIG. 4A to FIG. 4F show cross-sectional views of fabricating a lithography mask in a semiconductor device according to the present invention.

Referring to FIG. 4A, a mask layer 31 for an etch mask to form trenches is formed on a front face of a semiconductor wafer 30 of silicon of which both faces are polished. The mask layer 31 having a predetermined thickness is formed by depositing oxide or nitride by CVD or by coating resist on the front face of the wafer 300.

After the mask layer 31 of oxide is coated with photoresist, a first photoresist pattern 32 for forming apertures of a stencil mask is defined by exposure and development.

In this case, a first mirror image photoresist pattern(not shown in the drawing) having the mirror image of the first photoresist pattern 32 is also defined on another surface of the mask layer 31 since there are plenty of spaces to fabricate lithography masks on the wafer 30.

The first photoresist pattern 32 is to fabricate a lower mask of a stencil mask having double-story structure, while the first mirror image photoresist pattern is for an upper mask attached on the lower mask.

Accordingly, a lower stencil mask and an upper stencil mask are fabricated on the same wafer of substrate simultaneously.

From now on, the following description of the present invention is mainly focused on the steps of fabricating the lower stencil mask, and the steps of fabricating the upper stencil mask is regarded the same of the lower stencil mask.

Figure 4B:
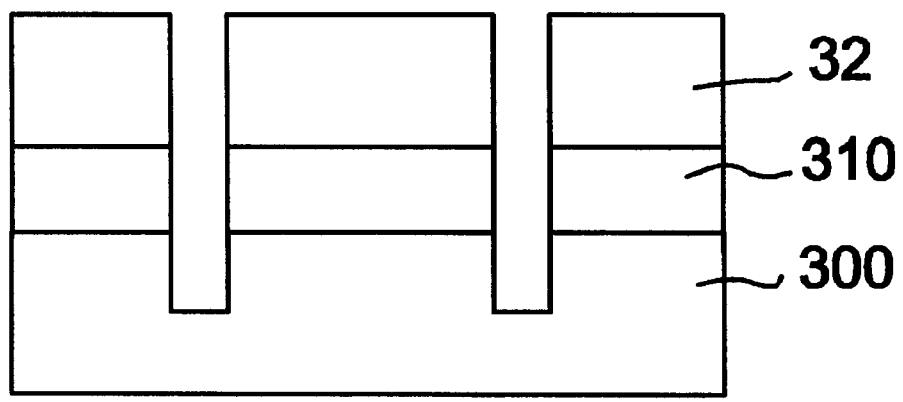

Besides, there is only one difference between the steps of forming the lower and upper stencil masks in that the apertures of the upper stencil mask are bigger than those of the lower stencil mask. Referring to FIG. 4B, a first etch mask 310 is formed by dry-etching the mask layer which is not covered with the first photoresist pattern 32. First trenches which will be used for apertures of a lower stencil mask are formed by removing a portion of the semiconductor substrate, to a predetermined thickness, which is not protected by the first photoresist pattern 32 and the first etch mask 310.

Figure 4C:
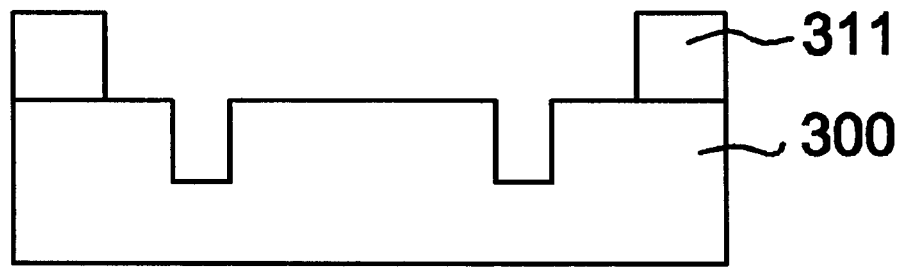

Referring to FIG. 4C, after the first photoresist pattern has been removed, a first step 311 to give a space between the lower and upper stencil masks which will be fabricated is formed by leaving a portion of the first etch mask of oxide at the edge of the area defining the lower stencil mask. Instead, the first step 311 may be formed by removing the first etch mask thoroughly, depositing another layer of low heat conductivity on the semiconductor substrate 300 and by leaving a portion of the layer at the edge of the area defining the low stencil mask by photolithography. The first step 311 reduces heat conduction between the upper and lower stencil masks which will be formed as well as separates the lower from the upper. Therefore, the first step 311 has to be formed with a substance of which heat conductivity is lower than that of the wafer 300 or the substrate 300.

Figure 4D:
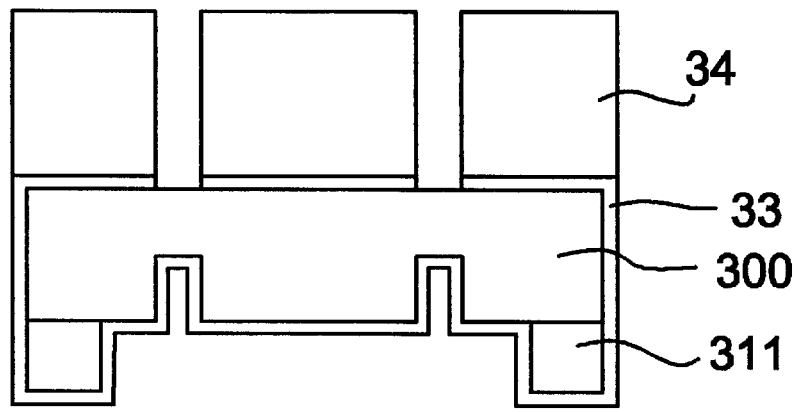

Referring to FIG. 4D, another mask layer 33 for forming a second etch mask for trenches or windows is formed on a whole surface of the semiconductor substrate 300 including the exposed surface of the first step 311. In this case, the mask layer 33 is formed by depositing a substance of which etch ratio is different that of the first step 311 such as nitride by CVD.

A back face of the semiconductor substrate 300 is laid upward by turning upside down the wafer 300.

After the nitride layer 33 on the back face of the substrate 300 has been coated with photoresist, a second photoresist pattern 34 exposing the surface of the nitride layer 33 corresponding to the trenches in FIG. 4B is formed by exposure and development.

Then, a second etch mask 33 for forming second trenches piercing the other trenches in FIG. 4B is formed by etching the nitride layer which is not covered with the second photoresist pattern 34 by dry etch. In this case, the second etch mask 33 exposes the back faces of the substrate 300 corresponding to the first trenches to be pierced.

Figure 4E:
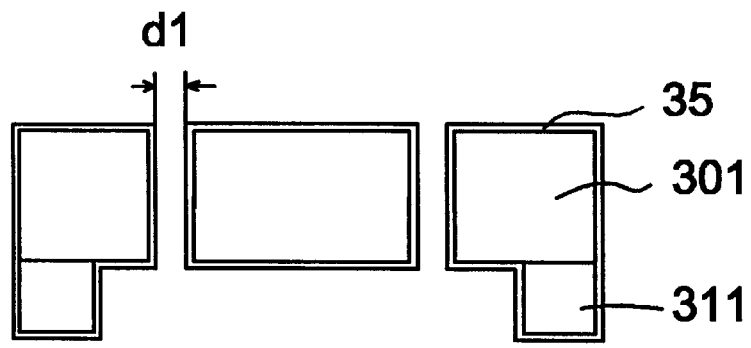

Referring to FIG. 4E, second trenches are formed by etching the exposed surface of the substrate which is not covered with the second photoresist pattern and the second etch mask. In this case, the etch of the second trenches has been carried out until the nitride layer 33 in the first trenches is exposed so as to make the first trenches adjacent to the second trenches.

The etch process of the second trenches are carried out by wet etch in use of KOH or a mixed solution of HF and HNO3. The wet etch is carried out in accordance with the following steps.

First, there are at least a first chip for a lower stencil mask and a second chip for an upper stencil mask having the mirror image of the lower stencil mask in a wafer. So, large patterns such as scribing lines at the boundary of each chip are etched by 'loading effect'.

Second, the etch has been carried on sufficiently until the first trenches meet the second trenches at the nitride layer.

Third, the formation of the second trenches is verified by examining the first trench pattern from the back face of the substrate in use of a microscope.

Finally, after the second photoresist pattern has been removed, all the remaining nitride layer is removed by wet etch in use of H3PO4 or the like.

Thus, the first and second trenches pierce the substrate completely to complete the apertures of a lower stencil mask. In this case, the apertures become paths through which electron/ion beams pass.

An electrically conductive layer 35 is formed on exposed surfaces of the semiconductor substrate 301 and the first step 311. In this case, the electrically conductive layer 35 is formed by depositing metal such as Pt, Pt—Pd, Ti or the like by sputtering, etc., and becomes a path for discharging electrons outside. When the electrically conductive layer 35 is formed with Pt, a barrier layer of Ti is inserted between the substrate 301 and the Pt layer 35 so as to improve the adhesiveness between Si and Pt.

Accordingly, a lower stencil mask of a double-story structure stencil mask is completed as well as an upper stencil mask having the mirror pattern of the lower stencil mask.

The sign 'd1' shows a diameter of the aperture in the lower stencil mask. As the drawings show the steps of forming the lower stencil mask, the apertures of the upper stencil mask are somewhat bigger than those of the lower.

Figure 4F:
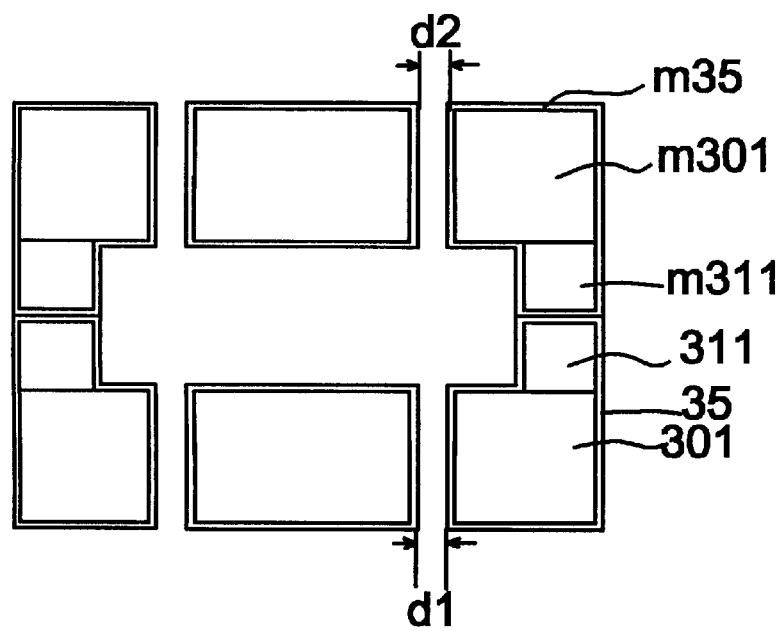

Referring to FIG. 4F, after the first step 311 of the lower stencil mask on which the electrically conductive layer 35 is formed has been laid upward, the upper stencil mask is attached to the lower stencil mask by bring the first and second steps 311 and m311 into contact. In this case, the attachment is carried out by depositing a film of Sn, Zn or the like on the first and second steps 311 and m311 and by applying voltage at 20 to 300° C., or by using silver paste directly.

The upper stencil mask is comprised of a patterned semiconductor substrate m301, a second step m311 and an electrically conductive layer m35. The upper stencil mask has the mirror pattern of the lower stencil mask but differs only in sizes of the apertures. In this case, the sign 'd2' shows the diameter of the aperture in the upper stencil mask corresponding to that of the lower stencil mask. 'd2' is bigger than 'd1' so that alignment margin of the apertures of respective stencil masks is secured.

An electrically-conductive holder, as not shown in the drawing, is attached to the bottom edges of the lower stencil mask. The holder becomes paths for discharging electrons generated by electron beams outside the stencil mask. In this case, an electrically conductive layer may be formed on a surface the holder by depositing Pt or the like.

Accordingly, the upper stencil mask, which has the mirror pattern of the lower stencil mask blocks most of electron/ion beams, while the lower stencil mask has the beams pass through the apertures overlapped with those of the upper stencil mask. Thus, energy accumulated on the lower stencil mask is minimized.

Therefore, thermal stress is minimized by losing heat generated from electron beams through the silicon patterns, supports and the metal layers. And, electrons are discharged outside the stencil mask through the metal layers and the holder.

Consequently the reliance of the projected images on a resist coated substrate is improved by reducing the distortion of the stencil mask.

It will be apparent to those skilled in the art that various modifications and variations can be made in a lithography mask and a fabricating method thereof of the present invention without departing from the spirit or scope of the inventions. Thus, it is intended that the present invention cover the modifications and variations of this invention provided they come within the scope of the appended claims and equivalents.

What is claimed is:

1. A lithography mask comprising:
    a first stencil mask having a first aperture pattern wherein a first electrically conductive layer is formed on a whole surface of the first stencil mask and wherein first beam-penetrating parts are formed in the first aperture pattern;
    a first protruding part on the edge of the upper face of the first stencil mask; and
    a second stencil mask having a second aperture pattern wherein a second electrically conductive layer is formed on a whole surface of the second stencil mask, wherein second beam-penetrating parts equal to or bigger than the first beam-penetrating parts and wherein the second stencil mask is attached to the first protruding part.

2. The lithography mask of claim 1, wherein the second aperture pattern transcribes the first aperture pattern.

3. The lithography mask of claim 1, wherein the first and second stencil masks are made of a semiconductor wafer.

4. The lithography mask of claim 1, wherein heat conductivity of the first protruding part is lower than that of the first and second stencil masks.

5. The lithography mask of claim 4, further comprising a third electrically conductive layer formed on a surface of the first protruding part.

6. The lithography mask of claim 1, wherein the first and third electrically conductive layers are made of Pt or Pt—Pd.

7. The lithography mask of claim 1, the first protruding part further comprising:

a second protruding part on the above surface of the first stencil mask; and a third protruding part on the bottom surface of the second stencil mask.

8. The lithography mask of claim 1, further comprising a holder supporting the first and second stencil masks, the holder attached to the bottom edge of the first stencil mask.

9. The lithography mask of claim 8, wherein the holder is made of an electrically conductive substance or a fourth electrically conductive layer is formed on a surface of the holder.

10. The lithography mask of claim 1, wherein the first and second aperture patterns have a thickness equal to a thickness of the first and second stencil masks, respectively.

11. The lithography mask of claim 1, wherein the first and second aperture patterns pass through to puncture the first and second stencil masks, respectively, and wherein beam-stopping parts are formed by the first and second electrically conductive layers on the whole surfaces of the first and second stencil masks, respectively.

12. A method of fabricating a lithography comprising the steps of:

forming a plurality of first and second trenches on predetermined portions of a wafer, wherein the first trenches have a first pattern and the second trenches have the mirror pattern of the first pattern, wherein first and second chip areas are defined on the wafer, wherein the first and second trenches are formed to a predetermined depth by patterning a front face of the wafer in the first and second chip areas, respectively;

forming first and second protruding parts at the edges of the first and second chip areas of the wafer, respectively;

forming a plurality of first and second apertures making the first and second trenches pierce the wafer, respectively, by removing predetermined portions of a back face of the wafer;

forming first and second chips by separating respectively the first and second chip areas from the wafer;

forming first and second electrically conductive layers on surfaces of the first and second chips, respectively; and attaching the second chip to the first chip by aligning the first and second apertures and by attaching the second protruding part to the first protruding part.

13. The method of fabricating a lithography mask of claim 12, further comprising the step of attaching a holder to a bottom edge of the first chip wherein the first electrically conductive layer is formed on a surface of the first chip.

14. The method of fabricating a lithography mask of claim 12, wherein heat conductivity of the first and second protruding parts is lower than that of the wafer.

15. The method of fabricating a lithography mask of claim 12, wherein the first and second protruding parts are formed by leaving portions of an etch mask for forming the first and second trenches.

16. The method of fabricating a lithography mask of claim 12, wherein the wafer is made of silicon, the first and second protruding parts are formed with oxide and the first and second electrically conductive layers are formed with Pt or Pt—Pd.

17. The method of fabricating a lithography mask of claim 12, wherein critical dimension of the second trenches is bigger than that of the first trenches.

18. The method of fabricating a lithography mask of claim 12, wherein the mirror pattern of the second chip transcribes the first pattern to have electron beams pass through both the second and first chips.

19. The method of fabricating a lithography mask of claim 12, wherein the depth of the first and second trenches depend on the thickness of the mask.

20. The method of fabricating lithography of claim 12, wherein the aligned first and second apertures do not effect beams passing through the first and second chips, wherein the first and second electrically conductive layers on a top surface of the first and second chips respectively terminate beams impinging on the first and second chips, and wherein one of the first and second conductive layers on the first and second chips terminates a substantial majority of the impinging beams to reduce a heat distortion effect of the impinging beams on the other one of the first and second chips.

* * * * *